United States Patent
Shemer et al.

(10) Patent No.: US 10,684,922 B2
(45) Date of Patent: Jun. 16, 2020

(54) ENHANCED DATA STORAGE USING COMPRESSED DATA

(71) Applicant: EMC IP Holding Company LLC, Hopkinton, MA (US)

(72) Inventors: Jehuda Shemer, Kfar Saba (IL); Felix Shvaiger, Nashua, NH (US); Arieh Don, Newton, MA (US); Anton Kucherov, Dudley, MA (US)

(73) Assignee: EMC IP HOLDING COMPANY LLC, Hopkinton, MA (US)

(*) Notice: Subject to any disclaimer, the term of this patent is extended or adjusted under 35 U.S.C. 154(b) by 0 days.

(21) Appl. No.: 16/035,185

(22) Filed: Jul. 13, 2018

(65) Prior Publication Data
US 2020/0019472 A1  Jan. 16, 2020

(51) Int. Cl.
| G06F 12/00 | (2006.01) |
| G06F 11/14 | (2006.01) |
| G06F 11/16 | (2006.01) |
| G06F 3/06 | (2006.01) |
| H03M 7/30 | (2006.01) |

(52) U.S. Cl.
CPC ......... *G06F 11/1464* (2013.01); *G06F 3/065* (2013.01); *G06F 3/0608* (2013.01); *G06F 3/0683* (2013.01); *G06F 11/1451* (2013.01); *G06F 11/1658* (2013.01); *H03M 7/30* (2013.01); *G06F 2201/84* (2013.01)

(58) Field of Classification Search
None
See application file for complete search history.

(56) References Cited

U.S. PATENT DOCUMENTS

| 10,019,323 | B1 * | 7/2018 | Bai | G06F 16/184 |
| 2017/0017553 | A1 * | 1/2017 | Peleg | G06F 11/1464 |
| 2018/0032261 | A1 * | 2/2018 | Singhai | G06F 3/0608 |
| 2019/0227734 | A1 * | 7/2019 | Iyer | G06F 3/0608 |
| 2019/0235793 | A1 * | 8/2019 | Aikawa | G06F 3/06 |

* cited by examiner

Primary Examiner — Jason W Blust
(74) Attorney, Agent, or Firm — Workman Nydegger

(57) ABSTRACT

Systems and methods for replicating data are disclosed. Data stored in a compressed form on a source storage array or device can be read and transmitted to a destination storage array or device. The replication of data is achieved without having to decompress the data.

18 Claims, 3 Drawing Sheets

ENHANCED DATA STORAGE USING COMPRESSED DATA

FIELD OF THE INVENTION

Embodiments of the invention relate to systems and methods for performing data protection operations. More particularly, embodiments of the invention relate to systems and methods for replicating data. Embodiments of the invention further relate to systems and methods for improving read and/or write performance and for enhancing link bandwidth in a computing system.

BACKGROUND

Protecting data is a significant concern to all entities that use data. In fact, an entity that does not protect its data will likely lose that data at some point for a variety of reasons. Thus, entities rely on data protection systems to generate backups of their data. By backing up their data, an entity can insure themselves from the consequences of a catastrophic loss of data.

Backups can be generated in a lot of different ways by data protection systems. Some data protection systems may protect data by replicating the data. Replication allows the replicated data to be much closer to the production data. In fact, replicated data can be close to mirrored data. However, replicating data, particularly when the data is compressed, can require substantial computing resources and consume significant bandwidth.

Conventionally, compressed data is replicated in accordance with a particular protocol, for example SCSI (Small Computer System Interface). In order to replicate compressed data, the compressed data is first accessed from the storage array. Next, the compressed data is decompressed. The decompressed data can then be transmitted to a destination or recipient. If the data is to be stored in a compressed form, the recipient may be required to compress the data and store the compressed data. This process consumes computing resources (compressing/decompressing the data) and bandwidth (transmitting uncompressed data instead of compressed data).

This process, however, is complicated by the fact that it is difficult to simply read and transmit compressed data. More specifically, the initiator and/or recipient of the data may know the size of the uncompressed data, but the initiator does not know the size of the compressed data. As a result, a read command (such as a SCSI read command that a server issues to a storage array) will fail because the amount of compressed data does not correspond to the amount of data requested (e.g., the uncompressed size). Thus, it is necessary for the storage array to decompress the data prior to transmitting the data. Systems and methods are therefore needed to conserve processing, memory or other computing resources and limit the amount of bandwidth used in transmitting data.

BRIEF DESCRIPTION OF THE DRAWINGS

In order to describe the manner in which at least some aspects of this disclosure can be obtained, a more particular description will be rendered by reference to specific embodiments thereof which are illustrated in the appended drawings. Understanding that these drawings depict only example embodiments of the invention and are not therefore to be considered to be limiting of its scope, embodiments of the invention will be described and explained with additional specificity and detail through the use of the accompanying drawings, in which.

DETAILED DESCRIPTION OF SOME EXAMPLE EMBODIMENTS

Figure 1:
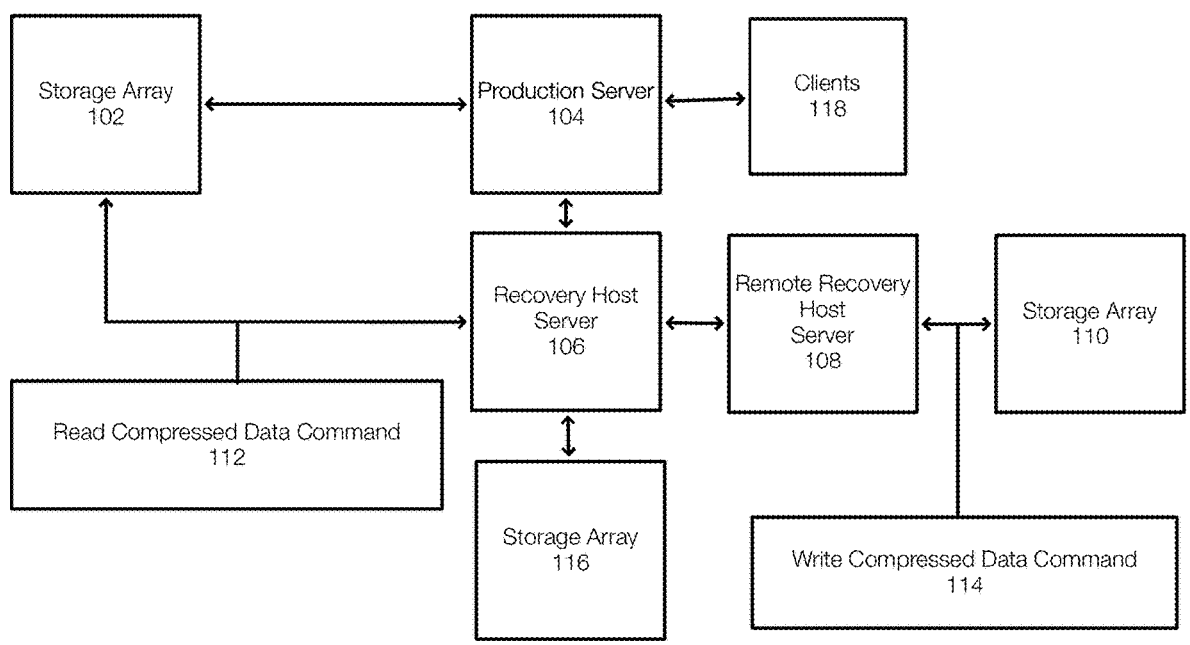
FIG. 1 illustrates an example of a data protection system configured to replicate data.

Embodiments of the invention relate to systems and methods for protecting data. Data protection operations may include, for example, replicating data, generating backups (full, incremental, etc), restoring data or the like or combination thereof. Embodiments of the invention further relate to systems and methods for performing data protection operations in a manner that conserves computing resources and bandwidth for transmission links. In particular, embodiments of the invention relate to systems and methods for replicating compressed data.

Replicating data, which is similar to generating backups, provides continuous data protection for both operational and disaster recovery. Data in both physical and/or virtual environments can be replicated. Further, data can be restored to any point in time. Embodiments of the invention allow data protection operations to be performed even if a failure occurs at multiple sites. For example, data may be replicated to one or more remote sites. Thus, data can be restored even if the production data fails and/or the data fails at a primary replication site and/or a backup site.

In many computing environments, data is compressed in order to conserve disk space needed to save the data. Conventionally, replicating compressed data requires computing resources to decompress the data in response to a read command, transmit the uncompressed data as part of the replication process (thus consuming bandwidth) and then compressing the data again at the destination to save storage space.

Embodiments of the invention relate to systems and methods for reading compressed data that effectively eliminate the need to decompress the data and that allow the compressed data to be transmitted and stored in a compressed form. This conserves both computing resources and bandwidth both at the origin of the data, during transmission of the data, and at the destination of the data.

When reading compressed data, conventional read commands require that the amount of data to be read be known. Unfortunately, the size of the compressed data is not typically known to the requestor or initiator. More specifically, when data is compressed, the amount of compression can depend on many factors. As a result, the size of the compressed data is unknown and a conventional read command fails unless the data is decompressed during the execution of the read command.

Embodiments of the invention improve the functioning of the computing system and of the replication system by using a read compressed data command. The read compressed data command allows the sender (initiator) to specify the uncompressed data size. In one example, the sender can specify the uncompressed data size because the compressed size may not be known to the sender/initiator. However, the read compressed data command does not fail when less than this amount (the uncompressed size) is returned in response. In one example, the response to the read compressed data command includes the compressed data and follows with a good status. When the good status is received, the operation is deemed complete and successful. Once the compresses data is received by the sender or initiator, the initiator may be able to specify the size of the compressed data and/or the size of the uncompressed data. In one example, this may simply the write operation.

FIG. 1 illustrates an example of a system that includes a data protection system or application configured to perform replication operations. FIG. 1 illustrates that the recovery host server 106 may interact with the storage array 102 through a production server 104. However, the recovery host server 106 may also interact directly with the storage array 102. In the context of replicating data a read compressed data command, the recovery host server 106 typically communicates directly with the storage array 102.

The production server 104 may be used in the context of applications associated with the storage array 102. FIG. 1 illustrates a storage array 102 associated with a production server 104. In this example, the storage array 102 may store production data that is actively being used by clients. The production server 104 may be integrated with the storage array 102 or may be host associated with the storage array. In one example, a request to the storage array 102 is performed by the production server 104 in the context of serving clients 118.

Thus, the storage array 102 and production server 104 may be associated with multiple clients 118 that are able to interact with the storage array 102 and the data stored thereon. The clients 118 can include smartphones, desktop computers, other server computers, tablet devices, or the like. The storage array 102 may include one or more devices configured to store data magnetically, optically, electronically or the like. The storage array 102 may be local to an entity, a datacenter, cloud storage, or the like or combination thereof. The storage arrays 110 and 116 may be similarly configured.

In FIG. 1, the recovery host server 106 is typically an initiator (or sender) of a replication process or operation, which is initiated in some examples by issuing a read command to the storage array 102. The read command may be a read compressed data command 112. The recovery host server 106 is also the recipient of the data requested from and transmitted by the storage array 102 in response to the read command. When replicating compressed data, the recovery host server 106 may issue commands directly to the storage array 102.

The recovery host server 106 may also be associated with the storage array 116 and the data on the storage array 102 could be replicated to the storage array 116. The data on the storage array 102 could also be replicated to the storage array 110. Thus, the data can be replicated to the storage array 110 and/or the storage array 116. By replicating data to one or more sites or storage arrays, the replicated data provides replication redundancy, for example, if the storage array 102 or data stored thereon becomes unavailable for any reason. Further, the storage arrays shown in FIG. 1 may be remote from each other.

More specifically, FIG. 1 illustrates a system in which data stored on the storage array 102 is replicated to the storage array 110. The recovery host server 106 may issue a read compressed data command 112 to the storage array 102. The read compressed data command 112 may specify a returned data size that corresponds to the size of the uncompressed data and an LBA (logical block address). Thus, the read compressed data command 112 allows compressed data to be successfully read even though the size of the returned data is unknown and may vary from one read compressed data command to another read compressed data command.

The storage array 102 returns or obtains the compressed data and transmits the compressed data to the recovery host server 106. When transmission of the compressed data is completed, the storage array 102 may transmit a good status. The good status indicates, to the recovery host server 106, that the transmission of the compressed data is complete and successful. By sending compressed data instead of uncompressed data, less bandwidth is used in the various transmission links and the computing resources needed to decompress the compressed data are conserved.

The recovery host server 106 can store the data in the storage array 116 (in compressed form) and/or the recovery host server 106 can send the compressed data to the remote recovery host server 108, which stores the compressed data on the storage array 110. The recovery host server 106 and/or the remote recovery host server 108 may decompress the data according to a predetermined compression algorithm to check the size of the compressed data or otherwise ensure that the data has been properly transmitted and is not corrupted or invalid.

The compressed data may be written using a write compressed data command 114, which enables compressed data to be written and ensures that the location to which the compressed data is written is properly handled. This is discussed in more detail below.

The replication performed by the computing system shown in FIG. 1 allows the production data to be restored at any point in time as long as the relevant data is available in the replicated data. In another example, the replicated data is the same as or substantially the same as the production data.

In one example, the recovery host server (or a data protection server) may take backups of the data on the storage array 102. For example, a snapshot of the data stored on the storage array 102 may be taken. At a later time, another snapshot may be taken. Snapshots or other backups may be performed regularly on the storage array 102. The incremental changes between successive snapshots or backups can effectively be identified by snapshot x—snapshot x−1. In one example, a bitmap of changed blocks can be maintained between shapshots. A write detector may be positioned to identify the changes that occur from one backup to the next. Thus, the bitmap may then identify all of the blocks that have changed since a prior backup.

As a result, the data replicated in the system of FIG. 1 typically involves the transmission of data that has changed since the prior backup. In some embodiments, the data protection system may operate with a certain block size or a track size. The block size (or track size) may depend on hardware configurations or on the backup application itself. By way of example, the following discussion assumes that the block size or track size is 128 kilobytes (KB).

As a result, if any bit within a particular block has changed since the last backup, the entire block is transmitted or replicated. Changed blocks can be identified from compressed or uncompressed data. As previously stated, the read compressed data command may specify the returned data size, which is the size of the uncompressed data. In one example, the read compressed data command may specify the block size or a multiple thereof or read valid data. For example, if the compressed data on the storage array 102 occupies 80 KB of a 128 KB block, the read compressed data command returns 80 KB. However, this still corresponds to an entire block of data. This good status allows the recipient or the device that issued the read command to understand that transmission is complete when all of the compressed data is received. In this example, the initial recipient is the recovery host server 106. The ultimate recipient may be the remote recovery host server 108 or the storage array 110.

Thus, embodiments of the invention may operate based on a block size or a track size. The track size and the block size may be the same size.

When performing a replication operation, the recovery host server 106 may request the blocks or tracks that include changed data since the most recent backup. The requested data is read and returned to the recovery host server 106 in compressed form.

The recovery host server 106 then transmits the compressed data to the remote recovery host server 108. When the compressed data is received by the remote recovery host server 108, the data may then be stored in the storage array 110 while still in compressed form. If the storage array 110 does not support the write compressed data command described herein, then the data is decompressed and stored in the storage array 110 in an uncompressed form.

When the storage array 110 supports compression the write compressed data command 114, the compressed data may be written to the storage array 110 using the write compressed data command 114. The write compressed data command 114 allows the compressed data to be stored appropriately in the storage array 110.

For example, assume that a track or block has a size of 128 KB. When initially compressed, the compressed data may have a size of 100 KB. If a change is made to this block of data and the data is recompressed at the storage array 102, the recompressed data may have a size of 110 KB.

To read this data during a replication operation, the read compressed data command 112 may specify an LBA and a size of 128 KB, which corresponds to the size of the data when uncompressed. Because the compressed size is not 128 KB, then only 110 KB (the size of the compressed data) is returned and a good status is also provided after transmitting the 110 KB.

Figure 2:
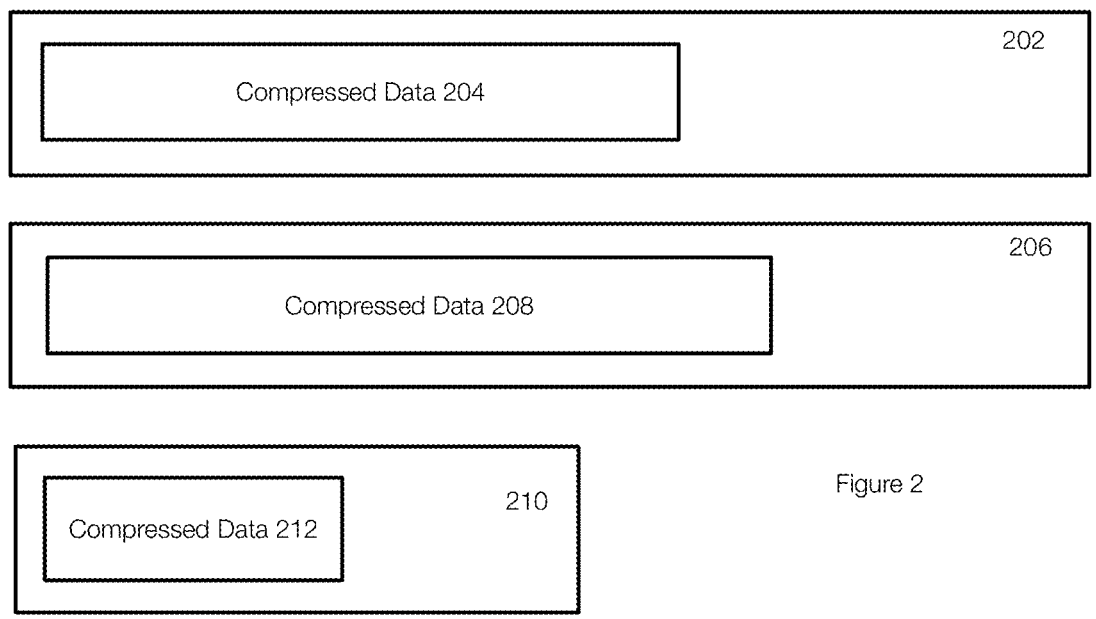
FIG. 2 illustrates an example of writing data to a storage array in a replication system.

The process of writing the compressed data is described with reference to FIG. 2. FIG. 2 illustrates an example of a write operation using a write compressed data command. FIG. 2 illustrates the same track or block on the storage array 110 at different points in time. Block 202 represents a block at time a. The block 202 includes compressed data 204, which was replicated from the storage array 102 to the storage array 110 at a previous time, which may or may not be time a. The block 206 represents the same block in the storage array at time b. At time b, the block 206 contains the compressed data 208.

More specifically, the compressed data 208 was received at the storage array 110, for example, because there was a change in the corresponding block in the storage array 102. The write compressed data command 114 was used to write the compressed data 208 to the block 206. As previously stated, the compressed data 208 is 110 KB while the previous compressed data 204 was 100 KB.

This 110 KB of data (plus any overhead such as headers, etc.) transmitted to the storage array 110 is thus written using the write compressed data command 114 by overwriting the contents of the block 206. When writing the compressed data, the data compressed data 204 is replaced with the compressed data 208. Alternatively, the compressed data 208 may be written to a new buffer of a different size. The compressed data 204 may be retained for some period of time.

In this case, the compressed data 208 represents a full block or track (e.g., 128 KB of data) when uncompressed. Thus, even though the compressed data 208 occupies less than the space in the block 206, the compressed data 208 represents 128 KB or a full block of data when uncompressed. The space between the compressed data 208 and the end of the block 206 may not be used.

In one embodiment, there is no partial write. In other words, an entire block is written in response to the write compressed data command. The new data 208 is not overlaid or compared to the compressed data 204 such that only the changes within the block are written in one example. Rather, the entire contents of the block 202 are deleted and replaced with the new compressed data 208. In one embodiment there may be no compression.

The write compressed data command 114 may also include a code indicating that the data being written is compressed. The code may be recognized by a controller of the storage array, by the remote recovery host server, or the like. This allows the compressed data to be written to the storage array 110 in compressed form as described herein.

If the data were to be compressed, for example, to the compressed data 212 in block 210 (e.g., 50 KB), it may be possible to request a smaller buffer in some instances. In other words, the data could be stored in a buffer of 64 KB instead of a buffer of 128 KB on the storage array 110.

Figure 3:
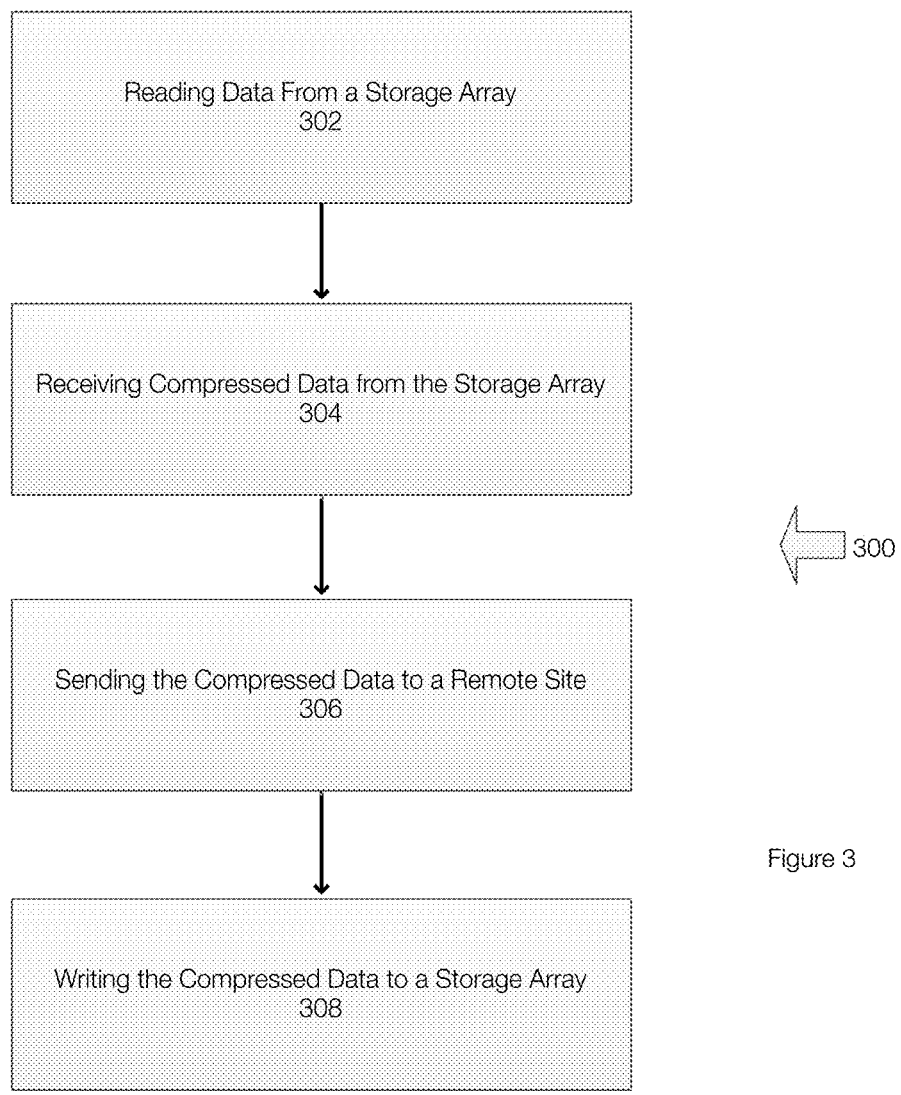
FIG. 3 illustrates an example of a method for replicating data in a data protection system.

FIG. 3 illustrates an example of a method for replicating data. FIG. 3 illustrates an example of a method 300 for replicating data. Typically, snapshots are performed at a storage array (e.g., a production storage array), which is an example of a storage array whose data is replicated to one or more other storage arrays. In the context of replicating data, a recovery host server may read 302 data from the storage array. This may include requesting data from the storage array. Typically, the data is requested by an initiator (e.g., the recovery host server). Because the length or amount of data being requested by the sender or initiator is unknown because the data is compressed, the initiator may send a read compressed data command that specifies a maximum data size, which is often the size of the requested data when uncompressed. The response of the storage array is to read the requested data from its internal storage without decompressing the requested data.

In addition, the initiator may send a request for all data has changed since a previous backup. The response to this command or request may include reading all blocks that include changed data. Thus, the response may include a plurality of blocks and the compressed data in each block may have different sizes. Each block, however, corresponds to 128 KB in this example.

Then, the recovery host server receives 304 the compressed data or the blocks from the storage array. In other words, the storage array may transmit the compressed data that is responsive to the read compressed data command to the recovery host server. The transmitted data, which may include multiple blocks, is still in compressed form. This advantageously reduces the bandwidth required compared to transmit the uncompressed data and relieves the storage array or other server from having to decompress the data prior to transmission.

In one example, the recovery host server may store the data in a storage array. Alternatively, or in addition, the compressed data may be sent 306 to a remote site or a remote recovery host server. Prior to sending, the recovery host server may decompress the compressed data to check for uncompressed data size or otherwise verify the validity or integrity of the compressed data.

The compressed data is then written 308 to a destination storage device or storage array using, by way of example only, a write compressed data command. Each block (or track) may be written using a write compressed data command. Because the replication or data protection system operates in the context of tracks or block, the entire track or block is used for the compressed data even though the compressed data does not require the full space available in the track or block. In one example, the destination storage device may be configured to store multiple versions such that the data can be recovered at any available point in time. In another embodiment, the focus is to ensure that the most current copy of the data is available by replicating the data to one or more sites. This may be achieved by taking a snapshot or other backup at predetermined intervals (e.g., 1 minute, two minutes, etc.) at the source storage device whose data is being replicated. This allows the data read from the source storage device to be limited to the blocks or tracks that have changed since the most recent backup.

It should be appreciated that the present invention can be implemented in numerous ways, including as a process, an apparatus, a system, a device, a method, or a computer readable medium such as a computer readable storage medium or a computer network wherein computer program instructions are sent over optical or electronic communication links. Applications may take the form of software executing on a general purpose computer or be hardwired or hard coded in hardware. In this specification, these implementations, or any other form that the invention may take, may be referred to as techniques. In general, the order of the steps of disclosed processes may be altered within the scope of the invention.

The embodiments disclosed herein may include the use of a special purpose or general-purpose computer including various computer hardware or software modules, as discussed in greater detail below. A computer may include a processor and computer storage media carrying instructions that, when executed by the processor and/or caused to be executed by the processor, perform any one or more of the methods disclosed herein.

As indicated above, embodiments within the scope of the present invention also include computer storage media, which are physical media for carrying or having computer-executable instructions or data structures stored thereon. Such computer storage media can be any available physical media that can be accessed by a general purpose or special purpose computer.

By way of example, and not limitation, such computer storage media can comprise hardware such as solid state disk (SSD), RAM, ROM, EEPROM, CD-ROM, flash memory, phase-change memory ("PCM"), or other optical disk storage, magnetic disk storage or other magnetic storage devices, or any other hardware storage devices which can be used to store program code in the form of computer-executable instructions or data structures, which can be accessed and executed by a general-purpose or special-purpose computer system to implement the disclosed functionality of the invention. Combinations of the above should also be included within the scope of computer storage media. Such media are also examples of non-transitory storage media, and non-transitory storage media also embraces cloud-based storage systems and structures, although the scope of the invention is not limited to these examples of non-transitory storage media.

Computer-executable instructions comprise, for example, instructions and data which cause a general purpose computer, special purpose computer, or special purpose processing device to perform a certain function or group of functions. Although the subject matter has been described in language specific to structural features and/or methodological acts, it is to be understood that the subject matter defined in the appended claims is not necessarily limited to the specific features or acts described above. Rather, the specific features and acts disclosed herein are disclosed as example forms of implementing the claims.

As used herein, the term 'module' or 'component' can refer to software objects or routines that execute on the computing system. The different components, modules, engines, and services described herein may be implemented as objects or processes that execute on the computing system, for example, as separate threads. While the system and methods described herein can be implemented in software, implementations in hardware or a combination of software and hardware are also possible and contemplated. In the present disclosure, a 'computing entity' may be any computing system as previously defined herein, or any module or combination of modules running on a computing system.

In at least some instances, a hardware processor is provided that is operable to carry out executable instructions for performing a method or process, such as the methods and processes disclosed herein. The hardware processor may or may not comprise an element of other hardware, such as the computing devices and systems disclosed herein.

In terms of computing environments, embodiments of the invention can be performed in client-server environments, whether network or local environments, or in any other suitable environment. Suitable operating environments for at least some embodiments of the invention include cloud computing environments where one or more of a client, server, or target virtual machine may reside and operate in a cloud environment.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method for replicating data in a computing system from a source storage to a destination storage, the method comprising:
reading data from the source storage with a read compressed data command, wherein the data is compressed and wherein a size of the compressed data is unknown;
receiving the compressed data from the source storage;
receiving a good status indicating that a transmission of the compressed data is completed;
storing the compressed data in the destination storage.

2. The method of claim 1, further comprising specifying a data size in the read compressed data command, wherein the data size is a size of the compressed data when uncompressed.

3. The method of claim 1, further comprising retrieving the compressed data from the source storage and sending the compressed data to a recovery host server without decompressing the data.

4. The method of claim 1, wherein compressed data is received by a recovery host server, further comprising decompressing the data by the recovery host server to verify a validity of the compressed data.

5. The method of claim 1, further comprising transmitting the compressed data to a remote recovery host server, wherein the remote recovery host server stores the compressed data in the destination storage.

6. The method of claim 1, further comprising writing the compressed data to the destination storage.

7. The method of claim 6, wherein the compressed data is written to an entire block or an entire track of the destination storage such that previously stored compressed data is overwritten.

8. The method of claim 1, wherein the compressed data corresponds to changes in data at the source storage that has changed since a previous backup.

9. The method of claim 8, wherein the compressed data that is transmitted, when uncompressed, corresponds to a block size or a track size.

10. A method for replicating data in a computing system from a source storage to a destination storage, the method comprising:
reading data, by a server, from the source storage with a read compressed data command, wherein the data is compressed at the source storage and wherein the read compressed data command specifies a size of the data when decompressed and does not specify a size of the compressed data;
receiving the compressed data from the source storage;
receiving a good status after receiving the compressed data, wherein the good status indicates that a transmission of the compressed data is complete even though less than the size of the data when decompressed is received;
transmitting the compressed data to a remote server associated with a destination storage; and
storing the compressed data in the destination storage.

11. The method of claim 10, wherein the read compressed data command is issued using a SCSI protocol.

12. The method of claim 10, further comprising retrieving the compressed data from the source storage and sending the compressed data to the server without decompressing the data.

13. The method of claim 10, wherein the compressed data is received by the server, further comprising decompressing the data by the server to verify a validity of the compressed data.

14. The method of claim 10, further comprising writing the compressed data to the destination storage.

15. The method of claim 14, wherein the compressed data is written to an entire block or an entire track of the destination storage such that previously stored compressed data is overwritten.

16. The method of claim 10, wherein the compressed data corresponds to changes in data at the source storage that has changed since a previous backup.

17. The method of claim 10, wherein the compressed data that is transmitted, when uncompressed, corresponds to a block size or a track size.

18. The method of claim 10, further comprising determining whether the destination storage supports the write compressed data command, wherein the compressed data is written in compressed form only when the write compressed data command is supported.

* * * * *